(12) United States Patent
Deguchi et al.

(10) Patent No.: US 9,503,665 B2
(45) Date of Patent: Nov. 22, 2016

(54) SEMICONDUCTOR INTEGRATED CIRCUIT AND IMAGE SENSOR CIRCUIT

(71) Applicant: Kabushiki Kaisha Toshiba, Minato-ku, Tokyo (JP)

(72) Inventors: Jun Deguchi, Cambridge, MA (US); Makoto Morimoto, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 266 days.

(21) Appl. No.: 14/481,029

(22) Filed: Sep. 9, 2014

(65) Prior Publication Data

US 2015/0155879 A1    Jun. 4, 2015

(30) Foreign Application Priority Data

Dec. 4, 2013  (JP) .................................. 2013-251026

(51) Int. Cl.
| | |
|---|---|
| *H01L 27/146* | (2006.01) |
| *H04N 5/378* | (2011.01) |
| *H03M 1/14* | (2006.01) |
| *H03M 1/48* | (2006.01) |

(52) U.S. Cl.
CPC ............... *H04N 5/378* (2013.01); *H03M 1/14* (2013.01); *H03M 1/48* (2013.01)

(58) Field of Classification Search
CPC ......... H04N 5/378; H03M 1/14; H03M 1/48
USPC ...................................................... 250/208.1
See application file for complete search history.

(56) References Cited

U.S. PATENT DOCUMENTS

| 5,045,685 A * | 9/1991 | Wall ...................... H01L 25/043 250/208.1 |
| 6,525,304 B1 * | 2/2003 | Merrill .................... H04N 3/155 250/208.1 |
| 6,617,567 B2 * | 9/2003 | Mukherjee .............. H03F 3/005 250/214 A |
| 8,766,843 B2 * | 7/2014 | Ueno .................. H03M 1/0863 341/155 |

OTHER PUBLICATIONS

Mohamed O. Shaker et al., "A 6-Bit 130-MS/s Low-Power Tracking ADC in 90 nm CMOS", Circuits and Systems (MWSCAS), 2010 53rd IEEE International Midwest Symposium on, 2010.
K.S. Kim et al., "nth-order multi-bit åD ADC using SAR quantiser", Electronics Letters vol. 46 No. 19, Sep. 16, 2010.

(Continued)

*Primary Examiner* — Seung C Sohn
(74) *Attorney, Agent, or Firm* — White & Case LLP

(57) ABSTRACT

The semiconductor integrated circuit includes a first converting circuit that receives the input analog signal, analog-to-digital converts the input analog signal and outputs a resulting first digital signal. The semiconductor integrated circuit includes an amplifier circuit that receives a reference analog signal, which is obtained by the first converting circuit digital-to-analog converting the first digital signal, and the input analog signal and outputs an amplified signal responsive to the difference between the reference analog signal and the input analog signal. The semiconductor integrated circuit includes a second converting circuit that analog-to-digital converts the amplified signal and outputs a resulting second digital signal. The semiconductor integrated circuit includes an output circuit that outputs an output signal obtained by a calculation of the first digital signal and the second digital signal.

20 Claims, 4 Drawing Sheets

(56) References Cited

OTHER PUBLICATIONS

Jeffrey Fredenburg et al., "a 90MS/s 11 MHz Bandwidth 62dB SNDR Noise-Shaping SAR ADC", IEEE Journal of Solid-State Circuits, vol. 47, No. 12, Dec. 2012.

Toshihisa Watabe et al., "A 33Mpixel 120fps CMOS Image Sensor Using 12b Column-Parallel Pipelined Cyclic ADCs", 2012 IEEE International Solid-State Circuit Conference, 2012.

Takayuki Toyama et al., "A 17.7Mpixel 120fps CMOS Image Sensor with 34.8Gb/s Readout", 2011 IEEE International Solid-State Circuits Conference, 2011.

* cited by examiner

SEMICONDUCTOR INTEGRATED CIRCUIT AND IMAGE SENSOR CIRCUIT

CROSS-REFERENCE TO RELATED APPLICATION

This application is based upon and claims the benefit of priority from the prior Japanese Patent Application No. 2013-251026, filed on Dec. 4, 2013, the entire contents of which are incorporated herein by reference.

BACKGROUND

Field

Embodiments described herein relate generally to a semiconductor integrated circuit and an image sensor circuit.

Background Art

Recent image sensor circuits have increased numbers of pixels, and sensor signals output from the pixels have significantly increased time constants.

And as higher frame rates and higher precisions are required, ADCs of image sensor circuits are required to meet increasingly stringent requirements.

DETAILED DESCRIPTION

A semiconductor integrated circuit according to an embodiment includes a first converting circuit that receives the input analog signal, analog-to-digital converts the input analog signal and outputs a resulting first digital signal. The semiconductor integrated circuit includes an amplifier circuit that receives a reference analog signal, which is obtained by the first converting circuit digital-to-analog converting the first digital signal, and the input analog signal and outputs an amplified signal responsive to the difference between the reference analog signal and the input analog signal. The semiconductor integrated circuit includes a second converting circuit that analog-to-digital converts the amplified signal and outputs a resulting second digital signal. The semiconductor integrated circuit includes an output circuit that outputs an output signal obtained by a calculation of the first digital signal and the second digital signal.

In the following, an embodiment will be described with reference to the drawings.

FIRST EMBODIMENT

Figure 1:
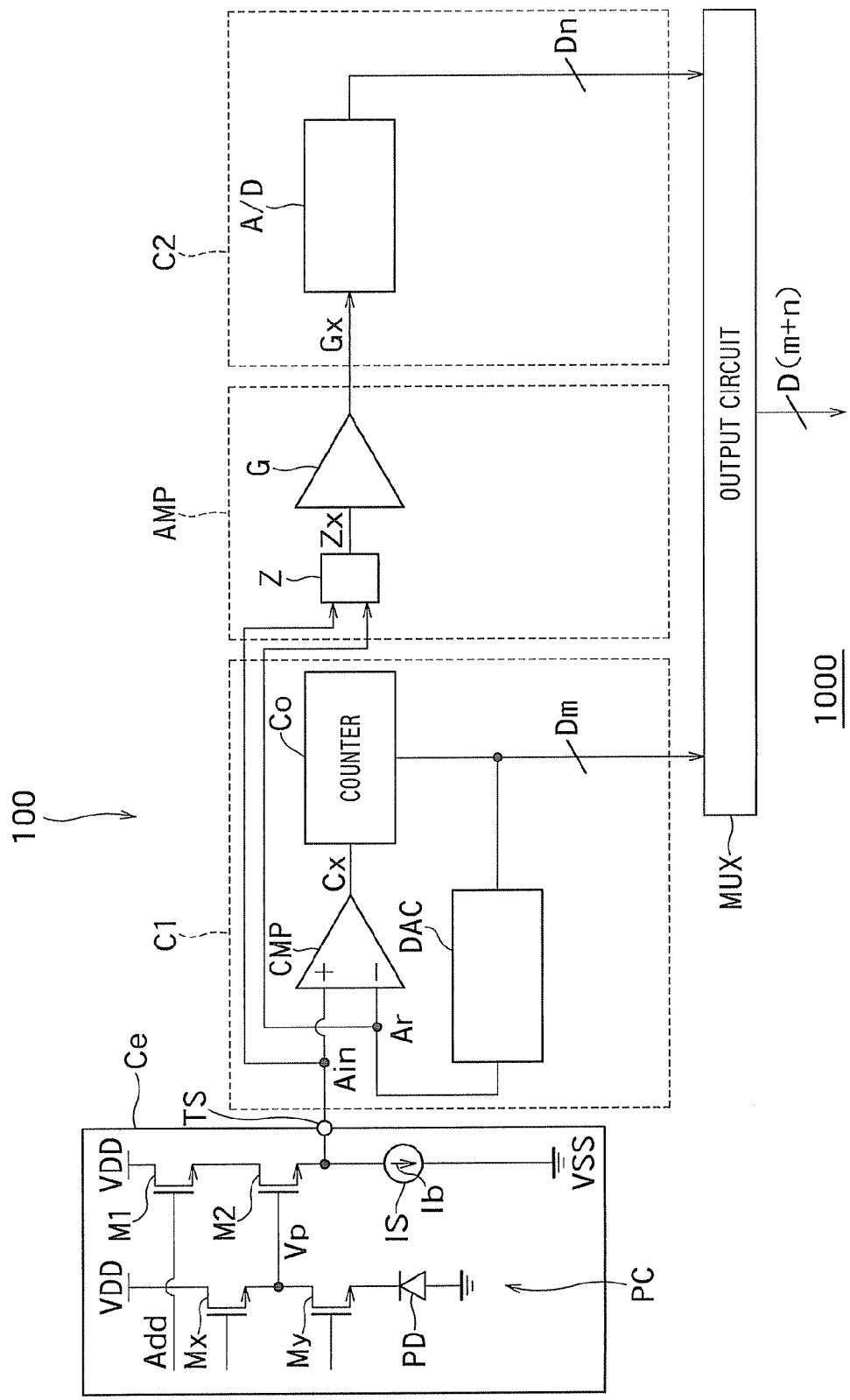
FIG. 1 is a block diagram showing an example of a configuration of an image sensor circuit 1000 according to a first embodiment.

FIG. 1 is a block diagram showing an example of a configuration of an image sensor circuit 1000 according to a first embodiment.

As shown in FIG. 1, the image sensor circuit 1000 includes a light receiving cell "Ce", a first converting circuit "C1", a second converting circuit "C2", an amplifier circuit "AMP" and an output circuit "MUX".

The first converting circuit "C1", the second converting circuit "C2", the amplifier circuit "AMP" and the output circuit "MUX" form a semiconductor integrated circuit 100.

The light receiving cell "Ce" outputs an input analog signal "Ain" responsive to the amount of received incident light at a signal terminal "TS".

As shown in FIG. 1, the light receiving cell "Ce" includes a light receiving circuit "PC", a first MOS transistor "M1", a second MOS transistor "M2" and a current source "Is", for example.

The first MOS transistor "M1" is connected between a power supply "VDD" and the signal terminal "TS" and is configured to receive an address signal "Add" at a gate thereof.

The first MOS transistor "M1" is turned on if the first MOS transistor "M1" is addressed by the address signal "Add" (that is, if the address signal "Add" is set at a "High" level).

If the first MOS transistor "M1" is not addressed by the address signal "Add" (that is, if the address signal "Add" is set at a "Low" level), the first MOS transistor "M1" is in the off state.

The second MOS transistor "M2" is connected in series with the first MOS transistor "M1" between the power supply "VDD" and the signal terminal "TS" and is configured to receive a voltage "Vp" responsive to the amount of received light at a gate thereof.

As shown in FIG. 1, the first MOS transistor "M1" and the second MOS transistor "M2" are nMOS transistors, for example.

The current source "Is" is connected between the signal terminal "TS" and a ground "VSS" and is configured to output a constant current "Ib".

The light receiving circuit "PC" is configured to receive light and output a voltage (pixel signal) "Vp" responsive to the amount of the received light to the gate of the second MOS transistor "M2".

As shown in FIG. 1, the light receiving circuit "PC" includes a first reset nMOS transistor "Mx", a second reset nMOS transistor "My" and a photodiode "PD", for example.

The first reset nMOS transistor "Mx" is connected to the power supply "VDD" at a drain thereof and to the gate of the second MOS transistor "M2" at a source thereof. A predetermined voltage is applied to a gate of the first reset nMOS transistor "Mx".

The second reset nMOS transistor "My" is connected to the gate of the second MOS transistor "M2" at a drain thereof. A predetermined voltage is applied to a gate of the second nMOS transistor "My".

The photodiode "PD" is connected to a source of the second reset nMOS transistor "My" at a cathode thereof and to the ground "VSS" at an anode thereof.

For example, if the first reset nMOS transistor "Mx" is turned on, and the second reset nMOS transistor "My" is turned off, the value of the voltage "Vp" is reset (that is, the value of the voltage "Vp" becomes equal to a power supply voltage).

If the first reset nMOS transistor "Mx" is turned off, and the second reset nMOS transistor "My" is turned on, the value of the voltage "Vp" becomes responsive to the amount of received light.

For example, the address signal "Add" is switched from the "Low" level to the "High" level. Then, the first MOS transistor "M1" in the light receiving cell "Ce" is turned on.

As a result, in response to the voltage "Vp" responsive to the amount of received light, the input analog signal "Ain" at the signal terminal "TS" varies. In addition, the input analog signal "Ain" is input to the first converting circuit "C1", and the first converting circuit "C1" analog-to-digital converts the input analog signal "Ain" into a first digital signal "Dm" and outputs the first digital signal "Dm". The first converting circuit "C1" performs m bits of analog-to-digital conversion during a settling time.

As shown in FIG. 1, the first converting circuit "C1" includes a digital-to-analog converting circuit "DAC", a comparator "CMP" and a counter "Co", for example.

The digital-to-analog converting circuit "DAC" digital-to-analog converts the first digital signal "Dm" and outputs a resulting reference analog signal "Ar".

The comparator "CMP" receives the input analog signal "Ain" and the reference analog signal "Ar" and outputs a comparison result signal "Cx" responsive to the magnitude relationship between the input analog signal "Ain" and the reference analog signal "Ar".

The counter "Co" counts logical changes of the comparison result signal "Cx" that occur when the input analog signal "Ain" becomes equal to or higher than the reference analog signal "Ar", and outputs the first digital signal "Dm" based on the resulting count value.

The digital value of the first digital signal "Dm" corresponds to the count value of the counter "Co", for example.

The amplifier circuit "AMP" receives the reference analog signal "Ar", which is obtained by the first converting circuit "C1" digital-to-analog converting the first digital signal "Dm", and the input analog signal "Ain". The amplifier circuit "AMP" outputs an amplified signal "Gx" responsive to the difference between the reference analog signal "Ar" and the input analog signal "Ain".

As shown in FIG. 1, the amplifier circuit "AMP" includes a calculating part "Z" and an amplifier part "G", for example.

The calculating part "Z" calculates the difference between the reference analog signal "Ar" and the input analog signal "Ain" and outputs a calculation signal "Zx" responsive to the calculation result.

The amplifier part "G" amplifies the calculation signal "Zx" and outputs the resulting amplified signal as the amplified signal "Gx".

The second converting circuit "C2" analog-to-digital converts the amplified signal "Gx" and outputs a resulting second digital signal "Dn". The second converting circuit "C2" performs n bits of analog-to-digital conversion after a settling time.

The output circuit "MUX" outputs an output signal "D(m+n)", which is a result of calculation of the first digital signal "Dm" and the second digital signal "Dn".

For example, the output circuit "MUX" performs a calculation so that m bits of digital values defined by the first digital signal "Dm" constitute higher order bits of the output signal "D(m+n)", and n bits of digital values defined by the second digital signal "Dn" constitute lower order bits of the output signal "D(m+n)".

The output circuit "MUX" calculates a digital value of the first digital signal "Dm" after a lapse of a first conversion period since the start of the digital-to-analog conversion by the digital-to-analog converting circuit "DAC" and a digital value of the second digital signal "Dn" after a lapse of a second conversion period since the end of the first conversion period.

The first conversion period and the second conversion period are preset, for example. The first conversion period is set to end at a timing when a limit value of the resolution of the digital-to-analog converting circuit is reached.

The output signal "D(m+n)" output from the output circuit "MUX" configured as described above is a digital value obtained by A/D conversion of the received light (analog signal).

Figure 2:
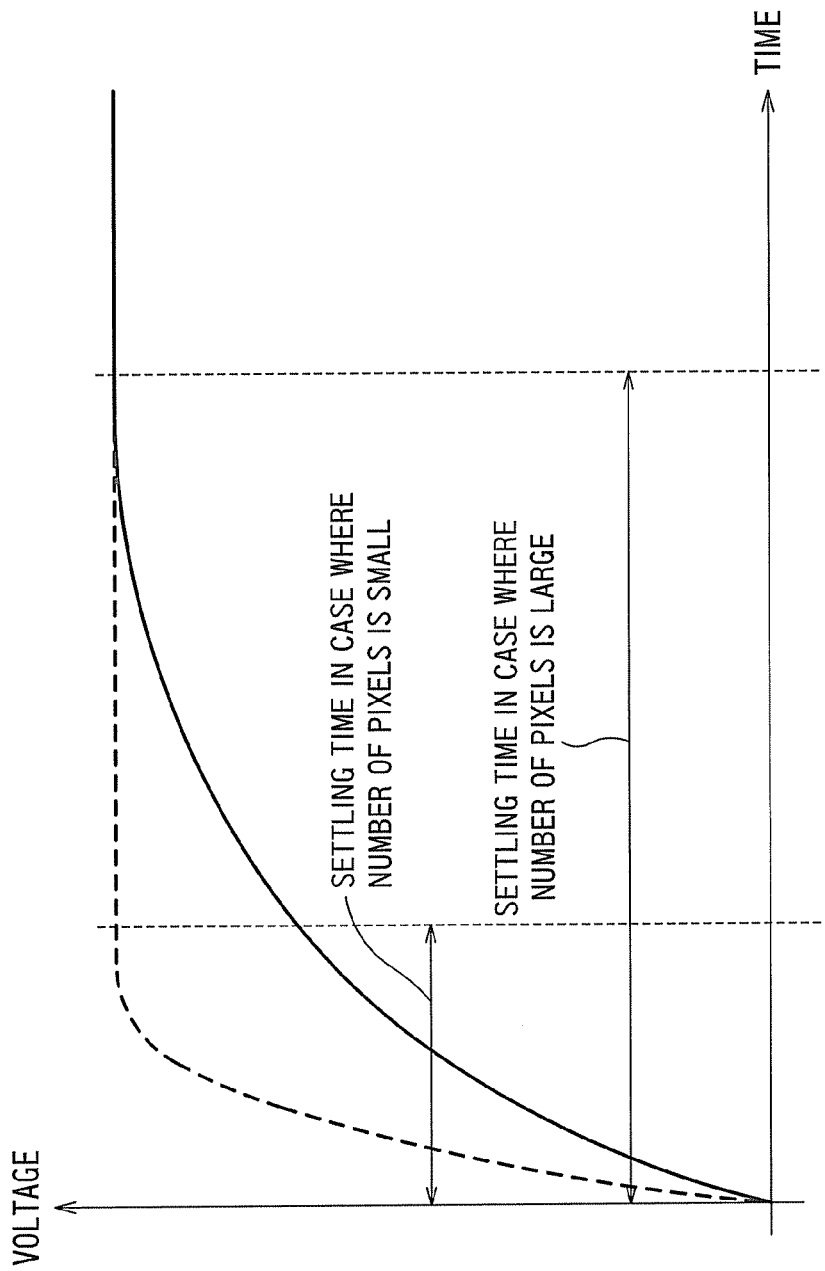
FIG. 2 is a waveform diagram of the input analog signal showing examples of the settling time in which the number of pixels (light receiving cells) is large and small.
Figure 3:
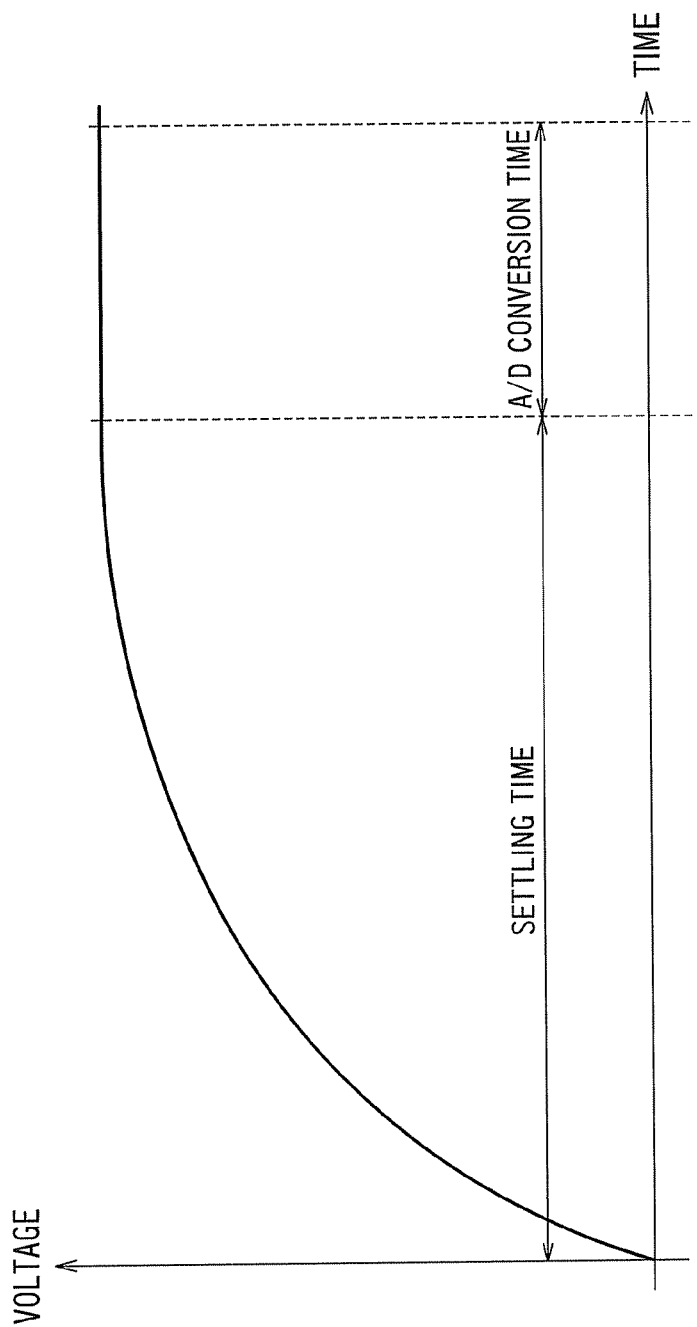
FIG. 3 is a waveform diagram of the input analog signal showing a prior art example in which an analog-to-digital conversion is performed after a lapse of a settling time.
Figure 4:
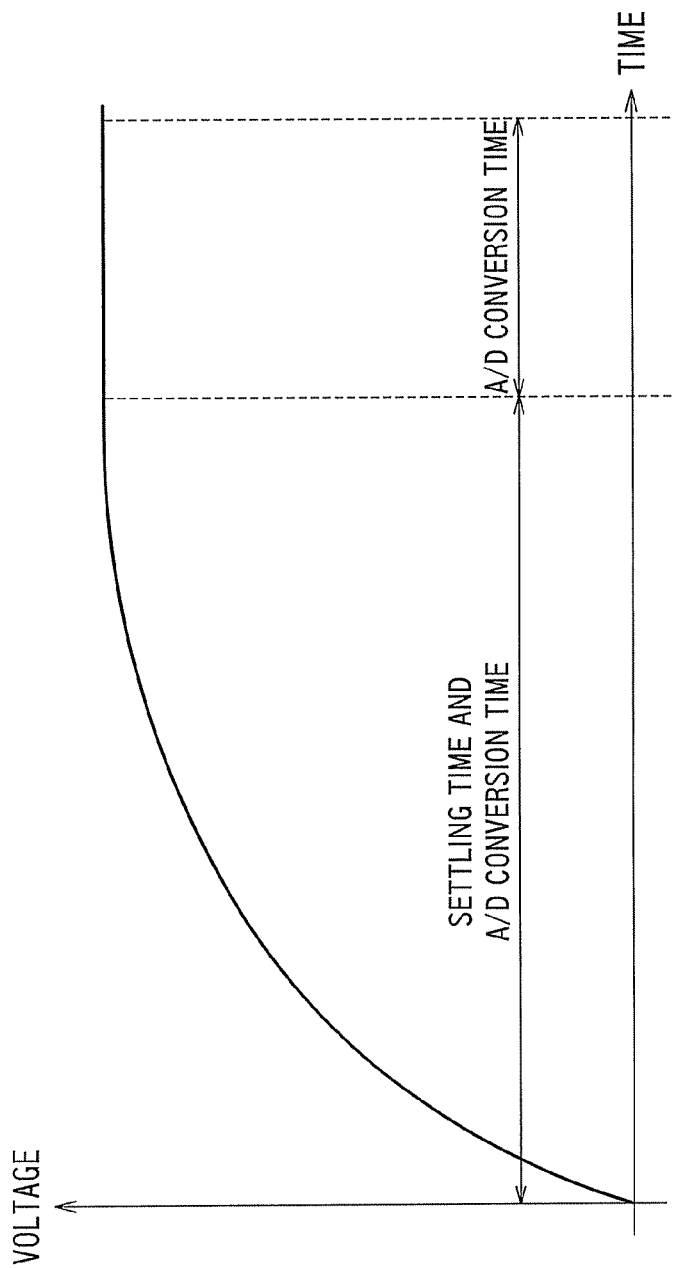
FIG. 4 is a diagram showing an example of the input analog signal according to the first embodiment in which a first analog-to-digital conversion is performed during a settling time and a second analog-to-digital conversion is performed after a lapse of the settling time.

Next, an operational characteristic of the image sensor circuit 1000 configured as described above will be described. FIG. 2 is a waveform diagram of the input analog signal showing examples of the settling time in which the number of pixels (light receiving cells) is large and small. FIG. 3 is a waveform diagram of the input analog signal showing a prior art example in which an analog-to-digital conversion is performed after a lapse of a settling time. FIG. 4 is a diagram showing an example of the input analog signal according to the first embodiment in which a first analog-to-digital conversion is performed during a settling time and a second analog-to-digital conversion is performed after a lapse of the settling time.

As shown in FIG. 2, in the case where the number of pixels (light receiving cells) is small, a parasitic capacitance involved with the light receiving cell is small, so that the settling time required for the voltage of the input analog signal to settle at a predetermined value is short.

On the other hand, in the case where the number of pixels (light receiving cells) is large, the parasitic capacitance involved with the light receiving cell is large, so that the settling time required for the voltage of the input analog signal to settle at a predetermined value is long.

In the case where the number of pixels (light receiving cells) is large, the settling time is long as described above, so that the analog-to-digital conversion time needs to be shortened (FIG. 3). In this case, the A/D converting circuit needs to operate at an ultrahigh speed, so that the power consumption substantially increases.

If the number of light receiving cells (pixels) further increases, and higher precision (of 14 bit or higher) is required, a required A/D conversion time probably cannot be ensured by the state of the art for reasons of the time constant of signal lines.

In view of this problem, according to the first embodiment, as shown in FIG. 4, a first analog-to-digital conversion by the first converting circuit "C1" is performed during a settling time (first converting period), and a second analog-to-digital conversion by the second converting circuit "C2" is performed only for a second conversion period after a lapse of the settling time.

As described above, the output circuit "MUX" calculates a digital value of the first digital signal "Dm" after a lapse of the first conversion period (which corresponds to the above-described settling time in this example) since the start of the digital-to-analog conversion by the digital-to-analog converting circuit "DAC" and a digital value of the second digital signal "Dn" after a lapse of the second conversion period since the end of the first conversion period.

The output circuit "MUX" outputs the output signal "D(m+n)", which is a result of calculation of the first digital signal "Dm" and the second digital signal "Dn". As described above, for example, the output circuit "MUX" performs a calculation so that m bits of digital values defined by the first digital signal "Dm" constitute higher order bits of the output signal "D(m+n)", and n bits of digital values defined by the second digital signal "Dn" constitute lower order bits of the output signal "D(m+n)".

The output signal "D(m+n)" output from the output circuit "MUX" is a digital value obtained by A/D conversion of the received light (analog signal).

In this way, the time required to analog-to-digital convert the input analog signal "Ain" can be reduced, and the precision of the analog-to-digital conversion can be improved by performing the analog-to-digital conversion in two stages.

That is, the semiconductor integrated circuit according to this embodiment can perform analog-to-digital conversion with higher precision at higher speed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
   a first converting circuit that receives an input analog signal, analog-to-digital converts the input analog signal and outputs a resulting first digital signal;
   an amplifier circuit that receives a reference analog signal, which is obtained by the first converting circuit digital-to-analog converting the first digital signal, and the input analog signal and outputs an amplified signal responsive to the difference between the reference analog signal and the input analog signal;
   a second converting circuit that analog-to-digital converts the amplified signal and outputs a resulting second digital signal; and
   an output circuit that outputs an output signal obtained by a calculation of the first digital signal and the second digital signal.

2. The semiconductor integrated circuit according to claim 1, wherein the first converting circuit comprises:
   a digital-to-analog converting circuit that digital-to-analog converts the first digital signal and outputs the reference analog signal;
   a comparator that receives the input analog signal and the reference analog signal and outputs a comparison result signal responsive to a magnitude relationship between the input analog signal and the reference analog signal; and
   a counter that counts logical changes of the comparison result signal that occur when the input analog signal becomes equal to or higher than the reference analog signal and outputs the first digital signal based a count value.

3. The semiconductor integrated circuit according to claim 1, wherein a digital value of the first digital signal corresponds to a count value.

4. The semiconductor integrated circuit according to claim 2, wherein the output circuit
   performs a calculation of a digital value of the first digital signal after a lapse of a first conversion period since the start of a digital-to-analog conversion by the digital-to-analog converting circuit and a digital value of a second digital signal after a lapse of a second conversion period since the end of the first conversion period.

5. The semiconductor integrated circuit according to claim 4, wherein the first conversion period and the second conversion period are previously set.

6. The semiconductor integrated circuit according to claim 5, wherein the first conversion period is set to end at a timing when a limit value of a resolution of the digital-to-analog converting circuit is reached.

7. The semiconductor integrated circuit according to claim 1, wherein the output circuit performs the calculation so that a digital value defined by the first digital signal constitutes a higher order bit of the output signal, and a digital value defined by the second digital signal constitutes a lower order bit of the output signal.

8. The semiconductor integrated circuit according to claim 1, wherein the amplifier circuit comprises:
   a calculating part that calculates a difference between the reference analog signal and the input analog signal and outputs a calculation signal responsive to a result of the calculation; and
   an amplifier part that amplifies the calculation signal and outputs the resulting signal as the amplified signal.

9. The semiconductor integrated circuit according to claim 2, wherein the output circuit performs the calculation so that a digital value defined by the first digital signal constitutes a higher order bit of the output signal, and a digital value defined by the second digital signal constitutes a lower order bit of the output signal.

10. The semiconductor integrated circuit according to claim 2, wherein the amplifier circuit comprises:
    a calculating part that calculates a difference between the reference analog signal and the input analog signal and outputs a calculation signal responsive to a result of the calculation; and
    an amplifier part that amplifies the calculation signal and outputs the resulting signal as the amplified signal.

11. An image sensor circuit, comprising:
    a light receiving cell that outputs an input analog signal responsive to an amount of received incident light at a signal terminal;
    a first converting circuit that receives the input analog signal, analog-to-digital converts the input analog signal and outputs a resulting first digital signal;
    an amplifier circuit that receives a reference analog signal, which is obtained by the first converting circuit digital-to-analog converting the first digital signal, and the input analog signal and outputs an amplified signal responsive to the difference between the reference analog signal and the input analog signal;
    a second converting circuit that analog-to-digital converts the amplified signal and outputs a resulting second digital signal; and
    an output circuit that outputs an output signal obtained by a calculation of the first digital signal and the second digital signal.

12. The image sensor circuit according to claim 11, wherein the first converting circuit comprises:
    a digital-to-analog converting circuit that digital-to-analog converts the first digital signal and outputs the reference analog signal;
    a comparator that receives the input analog signal and the reference analog signal and outputs a comparison result signal responsive to a magnitude relationship between the input analog signal and the reference analog signal; and
    a counter that counts logical changes of the comparison result signal that occur when the input analog signal becomes equal to or higher than the reference analog signal and outputs the first digital signal based on the resulting count value.

13. The image sensor circuit according to claim 11, wherein a digital value of the first digital signal corresponds to the count value.

14. The image sensor circuit according to claim 12, wherein the output circuit
performs a calculation of a digital value of the first digital signal after a lapse of a first conversion period since the start of a digital-to-analog conversion by the digital-to-analog converting circuit and a digital value of a second digital signal after a lapse of a second conversion period since the end of the first conversion period.

15. The image sensor circuit according to claim 14, wherein the first conversion period and the second conversion period are previously set.

16. The image sensor circuit according to claim 15, wherein the first conversion period is set to end at a timing when a limit value of a resolution of the digital-to-analog converting circuit is reached.

17. The image sensor circuit according to claim 11, wherein the output circuit performs the calculation so that a digital value defined by the first digital signal constitutes a higher order bit of the output signal, and a digital value defined by the second digital signal constitutes a lower order bit of the output signal.

18. The image sensor circuit according to claim 11, wherein the amplifier circuit comprises:
a calculating part that calculates a difference between the reference analog signal and the input analog signal and outputs a calculation signal responsive to a result of the calculation; and
an amplifier part that amplifies the calculation signal and outputs the resulting signal as the amplified signal.

19. The image sensor circuit according to claim 11, wherein the light receiving cell comprises:
a first MOS transistor that is connected between a power supply and the signal terminal and receives an address signal at a gate thereof;
a second MOS transistor that is connected in series with the first MOS transistor between the power supply and the signal terminal and receives a voltage responsive to the amount of received light at a gate thereof; and
a current source that is connected between the signal terminal and a ground.

20. The image sensor circuit according to claim 19, wherein the light receiving cell further comprises:
a light receiving circuit that receives light and outputs a voltage responsive to the amount of received light to the gate of the second MOS transistor.

* * * * *